US007701992B2

United States Patent
Choi (10) Patent No.: US 7,701,992 B2
(45) Date of Patent: Apr. 20, 2010

(54) SEMICONDUCTOR LASER DIODE HAVING GRADED INTERLAYER

(75) Inventor: Yoon Ho Choi, Seoul (KR)

(73) Assignee: LG Electronics Inc., Seoul (KR)

( * ) Notice: Subject to any disclaimer, the term of this patent is extended or adjusted under 35 U.S.C. 154(b) by 185 days.

(21) Appl. No.: 12/061,127

(22) Filed: Apr. 2, 2008

(65) Prior Publication Data

US 2008/0247435 A1 Oct. 9, 2008

(30) Foreign Application Priority Data

Apr. 5, 2007 (KR) .................... 10-2007-0033774

(51) Int. Cl.
*H01S 5/20* (2006.01)
*H01S 5/323* (2006.01)
*H01S 5/00* (2006.01)

(52) U.S. Cl. ................................. 372/45.01; 372/46.01

(58) Field of Classification Search ............... 372/45.01, 372/46.01

See application file for complete search history.

(56) References Cited

U.S. PATENT DOCUMENTS

2007/0290230 A1* 12/2007 Kawaguchi et al. ......... 257/196

* cited by examiner

*Primary Examiner*—Armando Rodriguez
(74) *Attorney, Agent, or Firm*—Ked & Associates, LLP

(57) ABSTRACT

A semiconductor laser diode having a graded interlayer is provided. The semiconductor laser diode has the graded interlayer between an active layer composed of InGaN and an electron blocking layer (EBL) composed of AlGaN. The graded interlayer is composed of $In_xAl_yGa_{1-x-y}N (0 \leq x \leq 0.2, 0 \leq y \leq 0.5)$ and is formed by grading a composition of group III materials. Accordingly, the active layer and the p-EBL have a reduced difference in rigidities and lattice parameters, and an abrupt gradient of an energy band and generation of a strain can be avoided in an interface between the active layer and the p-EBL. Since a crack can be prevented from being generated along the interface between the active layer and the p-EBL when a cleavage facet is formed, characteristics of the semiconductor laser diode can be improved.

20 Claims, 5 Drawing Sheets

SEMICONDUCTOR LASER DIODE HAVING GRADED INTERLAYER

CROSS-REFERENCE TO RELATED APPLICATION

The present application is based on, and claims priority from, Korean Application Numbers 10-2007-0033774 filed Apr. 5, 2007, the disclosure of which is incorporated herein by reference in its entirety.

BACKGROUND

The present invention relates generally to a semiconductor device, and in particular, to a semiconductor laser diode having a graded interlayer.

Semiconductor laser diodes have lately been put to practical use in various fields, such as optical communication, multiplex communication, and space communication for the reason that light emitted from the semiconductor laser diodes has a narrow frequency width and a sharp directivity. In addition, the semiconductor laser diodes are widely used in a high-speed laser printer and an optical storage device such as a compact disk player (CDP) and a CDP/recorder.

In particular, a nitride semiconductor laser diode has been noticed as a light source of the optical storage device because the nitride semiconductor laser diode has a direct transition type that ensures a high probability of laser oscillation. For another reason, the nitride semiconductor laser diode provides a short oscillation wavelength which covers from an ultra violet region to a green region due to a wide band gap energy.

In addition, the nitride semiconductor laser diode is increasingly popular in terms of environmental friendliness since arsenic (As) is not used as a main component.

The semiconductor laser diode used as the light source of the optical storage device has to satisfy a single mode and a high-output characteristic. For this, the semiconductor laser diode has a ridge waveguide to limit an injected current, so that a threshold current is reduced and a gain is achieved only when in the single mode.

The nitride semiconductor laser diode emits light when holes injected vertically through a ridge are combined with electrons in an active layer. At this time, when the electrons, which are relatively light in weight, pass intactly through the active layer, a problem arises in that the electrons cannot participate in radiative recombination in the active layer.

In order to address such a problem, an electron blocking layer (EBL) has been introduced. That is, by forming the EBL on an upper portion of the active layer, the number of electrons which cannot participate in the radiative recombination is reduced when the electors intactly pass through the active layer.

Figure 1:
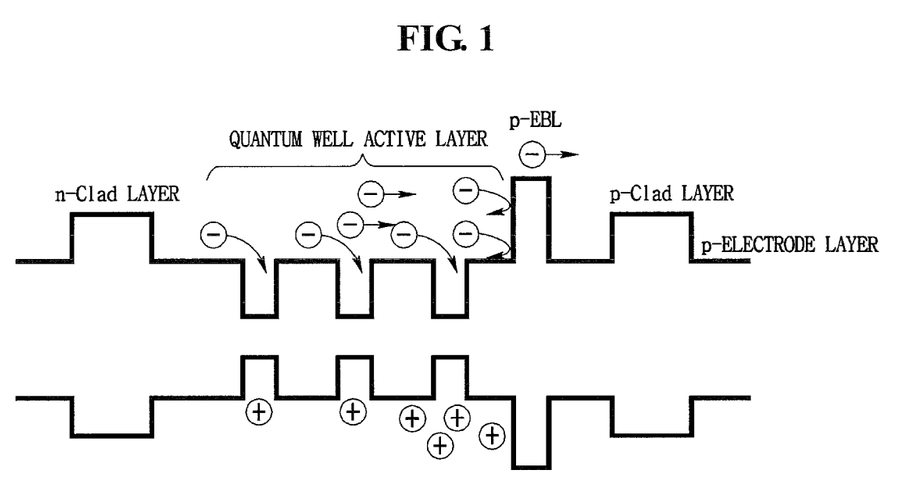
FIG. 1 is an energy band diagram for explaining a role of an electron blocking layer (EBL) of a conventional semiconductor laser diode.

FIG. 1 is an energy band diagram for explaining a role of an EBL of a conventional semiconductor laser diode.

Referring to FIG. 1, in order to prevent electrons provided from an n-clad layer from passing a quantum well and then jumping to a p-clad layer, a p-EBL is formed between an active layer and the p-clad layer.

The p-EBL acts as a sort of an energy barrier and thus prevents overflow of electrons. By confining the electrons provided from the n-clad layer within the quantum well active layer, the p-EBL enables the electrons to participate in the radiative recombination.

To function as an effective energy barrier, the p-EBL is composed of AlGaN with a high aluminum (Al) composition (e.g., above 20%).

The quantum well active layer is composed of InGaN. In comparison with the p-EBL composed of AlGaN, the quantum well active layer shows a significant difference in rigidities and lattice parameters. As a result, an energy band has an abrupt gradation, and a strain is generated in an interface between the quantum well active layer and the p-EBL.

Meanwhile, light generated by hole-electron recombination in the active layer of the semiconductor laser diode is amplified while reciprocating between a front cleavage facet and a back cleavage facet. The light is emitted when an oscillation requirement is satisfied.

Since the semiconductor laser diode operates according to the aforementioned principle, important features (e.g., threshold current, reliability, optical efficiency, etc.) of the semiconductor laser diode are dependent on the quality (e.g., roughness, angle, crack, etc.) of the cleavage facet.

The cleavage facet of the semiconductor laser diode is formed through a scribing and breaking process in which a physical strength is applied. Therefore, the quality of the cleavage facet is sensitive to a material's rigidity, a strain, etc.

Figure 2:
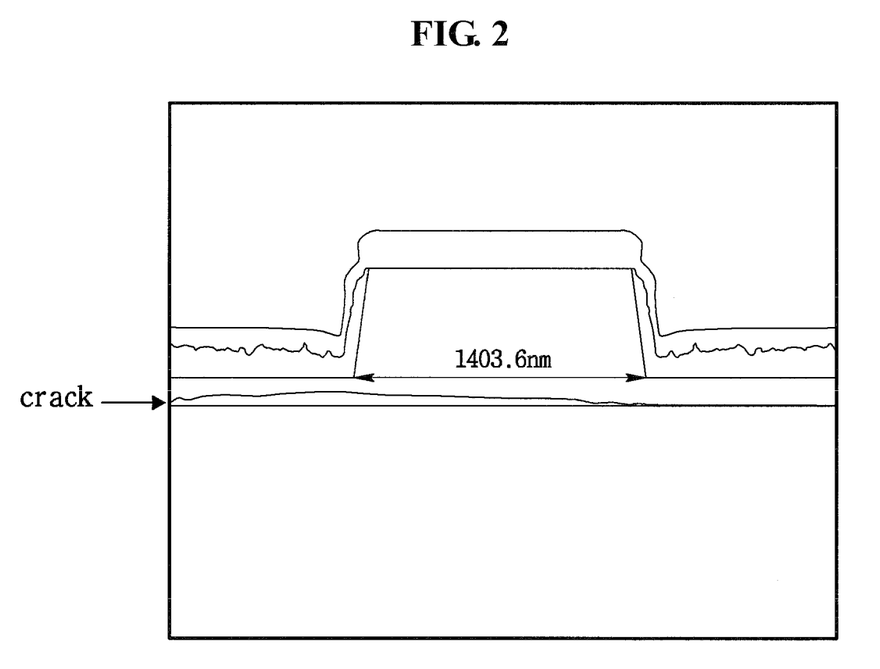
FIG. 2 is a photograph illustrating a crack generated in a cleavage facet of a conventional semiconductor laser diode.

However, in the conventional semiconductor laser diode, the active layer and the p-EBL have significantly different rigidities and lattice parameters from each other. Therefore, while forming the cleavage facet, as shown in FIG. 1, a crack-shaped defect is formed in the cleavage facet along the interface between the active layer and the p-EBL.

SUMMARY

An object of the present invention is to provide a semiconductor laser diode.

In one general aspect, a semiconductor laser diode comprises: a laminated structure composed of an n-contact layer, an n-clad layer, an n-waveguide layer, an active layer, a graded interlayer, an EBL, and a p-waveguide layer which are sequentially formed on an upper portion of a substrate; and a ridge composed of a p-clad layer, having a protruding center portion and formed on an upper portion of the p-waveguide layer, and a p-contact layer formed on an upper portion of the protruding p-clad layer, wherein the graded interlayer is composed of $In_xAl_yGa_{1-x-y}N (0 \leq x \leq 0.2, 0 \leq y \leq 0.5)$ and is formed by grading a composition of group III materials.

In another general aspect, there is provided a semiconductor laser diode, wherein: an n-contact layer, an n-clad layer, an n-waveguide layer, an active layer, a graded interlayer, an EBL, and a p-waveguide layer are sequentially formed on an upper portion of a substrate; a portion of the n-contact layer is exposed by performing mesa etching on regions from the p-waveguide layer to a portion of the n-contact layer; a p-clad layer having a protruding center portion is formed on an upper portion of the p-waveguide layer, and a p-contact layer is formed on an upper portion of the protruding p-clad layer to form a ridge; a protective layer is formed on a lateral surface of the ridge and the upper portion of the p-clad layer; an electrode is formed by embracing the p-contact layer and a portion of the protective layer; an electrode is formed on an upper portion of the exposed n-contact layer; and the graded interlayer is composed of $In_xAl_yGa_{1-x-y}N (0 \leq x \leq 0.2, 0 \leq y \leq 0.5)$, and is formed by grading a composition of group III materials.

In still another general aspect, there is provided a semiconductor laser diode, wherein: an n-contact layer, an n-clad layer, an n-waveguide layer, an active layer, a graded interlayer, an EBL, and a p-waveguide layer are sequentially formed on an upper portion of a substrate; a p-clad layer having a protruding center portion is formed on an upper portion of the p-waveguide layer, and a p-contact layer is formed on an upper portion of the protruding p-clad layer to form a ridge; a protective layer is formed on a lateral surface of the ridge and the upper portion of the p-clad layer; an electrode is formed by embracing the p-contact layer and a portion of the protective layer; an electrode is formed on a lower portion of the substrate; and the graded interlayer is composed of $In_xAl_yGa_{1-x-y}N(0 \leq x \leq 0.2, 0 \leq y \leq 0.5)$, and is formed by grading a composition of group III materials.

In the aforementioned aspect of the present invention, the active layer may be composed of InGaN, and the EBL may be composed of AlGaN.

In addition, the graded interlayer may be composed of $In_xGa_{1-x}N(0 \leq x \leq 0.2)$, and an indium (In) composition may be graded such that a starting composition of indium (In) is 20% and an ending composition of indium (In) is 0%. In this case, the starting composition of indium (In) of the graded interlayer may be equal to the indium (In) composition of the active layer.

In addition, the graded interlayer may be composed of $Al_yGa_{1-y}N(0 \leq y \leq 0.5)$, and an aluminum (Al) composition may be graded such that a starting composition of aluminum (Al) is 0% and an ending composition of aluminum (Al) is 50%. In this case, the ending composition of aluminum (Al) of the graded interlayer may be equal to the aluminum (Al) composition of the EBL.

In addition, the graded interlayer may be composed of $In_xAl_yGa_{1-x-y}N(0 \leq x \leq 0.2, 0 \leq y \leq 0.5)$, and an indium (In) composition and an aluminum (Al) composition may be graded such that starting compositions of indium (In) and aluminum (Al) are respectively 20% and 0% and ending compositions of indium (In) and aluminum (Al) are respectively 0% and 50%. In this case, the starting composition of indium (In) of the graded interlayer may be equal to the indium (In) composition of the active layer, and the ending composition of aluminum (Al) may be equal to the aluminum (Al) composition of the EBL.

In addition, a doping type of the graded interlayer may be any one of an n-type, a p-type, and an undoped type.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION

Now, exemplary embodiments of the present invention will be described in detail with reference to the accompanying drawings. The drawings are only illustrative of the exemplary embodiments of the present invention and are provided in order to facilitate understanding of principles and concepts of the present invention.

Figure 3:
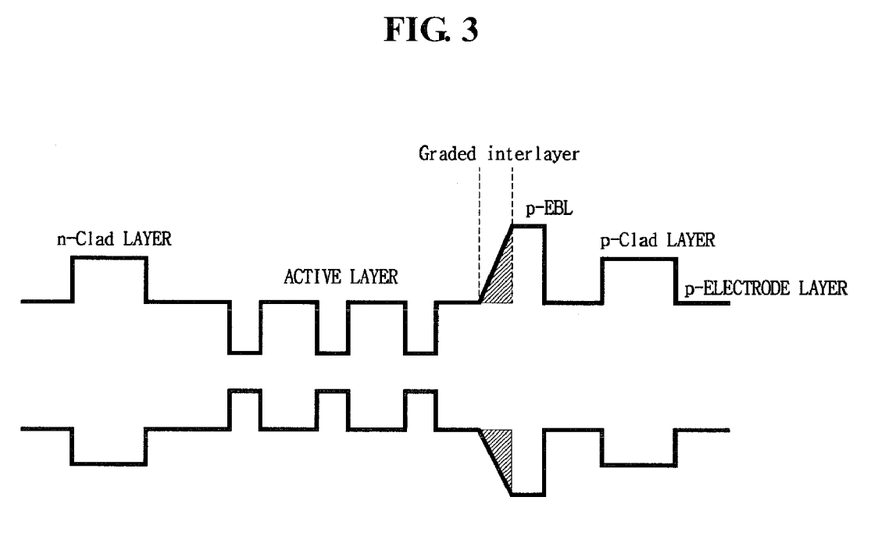
FIG. 3 is an energy band diagram of a semiconductor laser diode having a graded interlayer according to the present invention.

An energy band diagram of a semiconductor laser diode having a graded interlayer of the present invention will be described with reference to FIG. 3. The graded interlayer is formed between an active layer composed of InGaN and a p-electron blocking layer (EBL) composed of AlGaN by grading a composition of group III materials.

With this structure, the active layer and the p-EBL have a reduced difference in rigidities and lattice parameters. Therefore, an abrupt gradient of an energy band and generation of a strain can be avoided in an interface between the active layer and the p-EBL.

Figure 4:
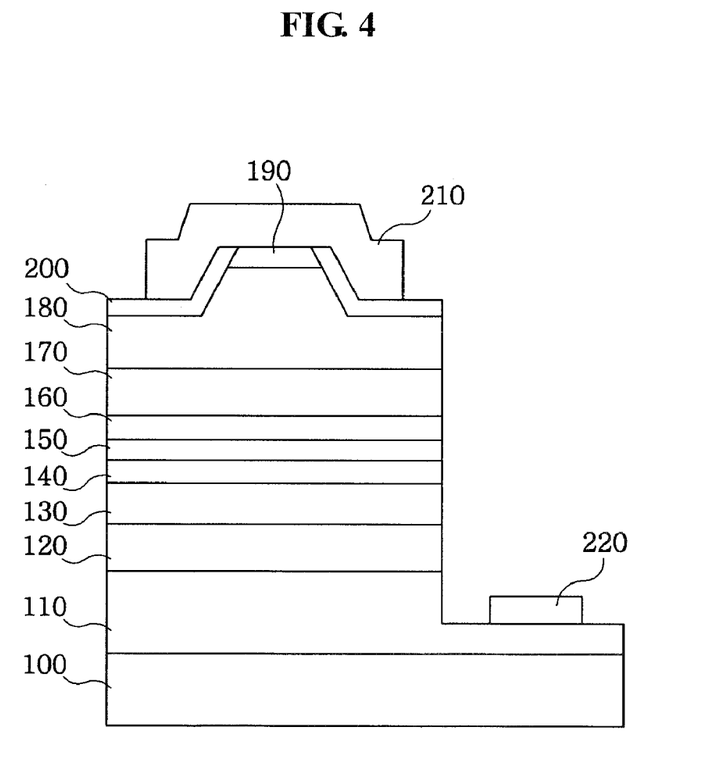
FIG. 4 is a cross-sectional view of a semiconductor layer diode having a graded interlayer according to an embodiment of the present invention.

A semiconductor layer diode having a graded interlayer according to an embodiment of the present invention will be described with reference to FIG. 4.

An n-contact layer 110, an n-clad layer 120, an n-waveguide layer 130, an active layer 140, a graded interlayer 150, an EBL 160, and a p-waveguide layer 170 are sequentially laminated on an upper portion of a substrate 100.

A portion of the n-contact layer 110 is exposed by performing mesa etching on regions from the p-waveguide layer 170 to a specific portion of the n-contact layer 110.

A p-clad layer 180 having a protruding center portion is formed on an upper portion of the p-waveguide layer 170. A p-contact layer 190 is formed on an upper portion of the protruding p-clad layer 180 to form a ridge.

A protective layer 200 is formed on a lateral surface of the ridge and the upper portion of the p-clad layer 180.

An electrode 210 is formed by embracing the p-contact layer 190 and a portion of the protective layer 200. An electrode 220 is formed on an upper portion of the exposed n-contact layer 110.

The substrate 100 may be a sapphire ($Al_2O_3$) substrate, a silicon carbide (SiC) substrate, a silicon (Si) substrate, a gallium arsenide (GaAs) substrate, or the like. Preferably, the sapphire substrate is used.

In general, the n-contact layer 110 is composed of an n-GaN layer, and the n-clad layer 120 is composed of $In_xAl_yGa_{1-x-y}N(0 \leq x<1, 0 \leq y<1, 0 \leq x+y<1)$.

The n-waveguide layer 130 is composed of a material having a lower refractive index than the active layer 140. In general, the n-waveguide layer 130 is composed of an n-GaN layer.

The active layer 140 has a single quantum well structure, in which a barrier layer composed of $In_xGa_{1-x}N(0 \leq x<1)$ and a well layer are formed, or a multi quantum well structure in which the barrier layer and the well layer are sequentially and repeatedly laminated.

The graded interlayer 150 is formed by grading a composition of group III materials so that the active layer 140 and the EBL 160 have a reduced difference in rigidities and lattice parameters.

The graded interlayer 150 may be composed of $In_xGa_{1-x}N$ ($0 \leq x \leq 0.2$) wherein an indium (In) composition can be graded in such a manner that a starting composition of indium (In) is 20% and an ending composition of indium (In) is 0%. That is, the indium (In) composition is gradually decreased from 20% to 0%.

In this case, it is preferable that the starting composition of indium (In) of the graded interlayer 150 is equal to an indium (In) composition of the active layer 140. That is, it is preferable that the indium (In) composition is graded from a percentage (%) of the indium (In) composition of the active layer 140 to 0%.

Further, the graded interlayer 150 may be composed of $Al_yGa_{1-y}N(0 \leq y \leq 0.5)$ wherein an aluminum (Al) composition is graded in such a manner that a starting composition of aluminum (Al) is 0% and an ending composition of aluminum (Al) is 50%. That is, the aluminum (Al) composition is gradually increased from 0% to 50%.

In this case, it is preferable that the ending composition of aluminum (Al) of the graded interlayer 150 is equal to an aluminum (Al) composition of the EBL 160. That is, it is preferable that the aluminum (Al) composition is graded from 0% to a percentage (%) of the aluminum (Al) composition of the EBL 160.

Furthermore, the graded interlayer 150 may be composed of $In_xAl_yGa_{1-x-y}N(0 \leq x \leq 0.2, 0 \leq y \leq 0.5)$ wherein an indium (In) composition and an Aluminum (Al) composition are graded.

In this case, a starting composition of indium (In) is 20%, a starting composition of aluminum (Al) is 0%, an ending composition of indium (In) is 0%, and an ending composition of aluminum (Al) is 50%. That is, the indium (In) composition is decreased from 20% to 0%, and the aluminum (Al) composition is increased from 0% to 50%.

In this case, it is preferable that the starting composition of indium (In) of the graded interlayer 150 is equal to the indium (In) composition of the active layer 140, and the ending composition of aluminum (Al) is equal to the aluminum (Al) composition of the EBL 160. That is, the indium (In) composition is decreased from a percentage (%) of the indium (In) composition of the active layer 140 to 0%, and the aluminum (Al) composition is increased from 0% to a percentage (%) of the aluminum (Al) composition of the EBL 160.

The graded interlayer 150 may be used irrespective of a doping type. That is, any one of an n-type, a p-type, and an undoped type may be used as the doping type of the graded interlayer 150.

The EBL 160 prevents electron overflow caused by a low hole carrier concentration and a low mobility of a p-type nitride semiconductor. The EBL 160 is composed of an AlGaN layer.

In particular, to function as an effective energy barrier, the EBL 160 is preferably composed of AlGaN having a high aluminum (Al) composition (e.g., above 20%).

The p-waveguide layer 170 is composed of a material having a lower refractive index than the active layer 140. Preferably, the p-waveguide layer 170 is composed of a p-GaN layer.

The p-clad layer 180 is composed of the same material as the n-clad layer 120 except that an injected conductive impurity is different. That is, the p-clad layer 180 is composed of $p-In_xAl_yGa_{1-x-y}N(0 \leq x<1, 0 \leq y<1, 0 \leq x+y<1)$.

The p-contact layer 190 is composed of the same material as the n-contact layer 110 except that an injected conductive impurity is different. That is, the p-contact layer 190 is composed of p-GaN, and has a higher doping density than the p-clad layer 180 in order to decrease a contact resistance with respect to the electrode 210.

The protective layer 220 is composed of any one of materials selected from a group consisting of $SiO_2$, $Si_3N_4$, $Al_2O_3$, HfO, and $TiO_2$.

The electrode 210 is composed of any one of materials selected from a group consisting of chromium (Cr), nickel (Ni), gold (Au), aluminum (Al), titanium (Ti), and platinum (Pt). Alternatively, the electrode 210 is composed of an alloy of the above metallic materials.

As such, according to the present invention, since the graded interlayer, in which a composition of group III materials is graded, is formed between the active layer composed of InGaN and the EBL composed of AlGaN, the active layer and the EBL can have a reduced difference in rigidities and lattice parameters. Accordingly, an abrupt gradient of an energy band and generation of a strain can be avoided in an interface between the active layer and the EBL.

Therefore, according to the present invention, when a cleavage facet is formed, a crack can be prevented from being generated along the interface between the active layer and the EBL. Accordingly, characteristics of the semiconductor laser diode can be improved, for example, in terms of a radial distribution pattern, lifespan, reliability, optical efficiency, driving current, etc.

Figure 5:
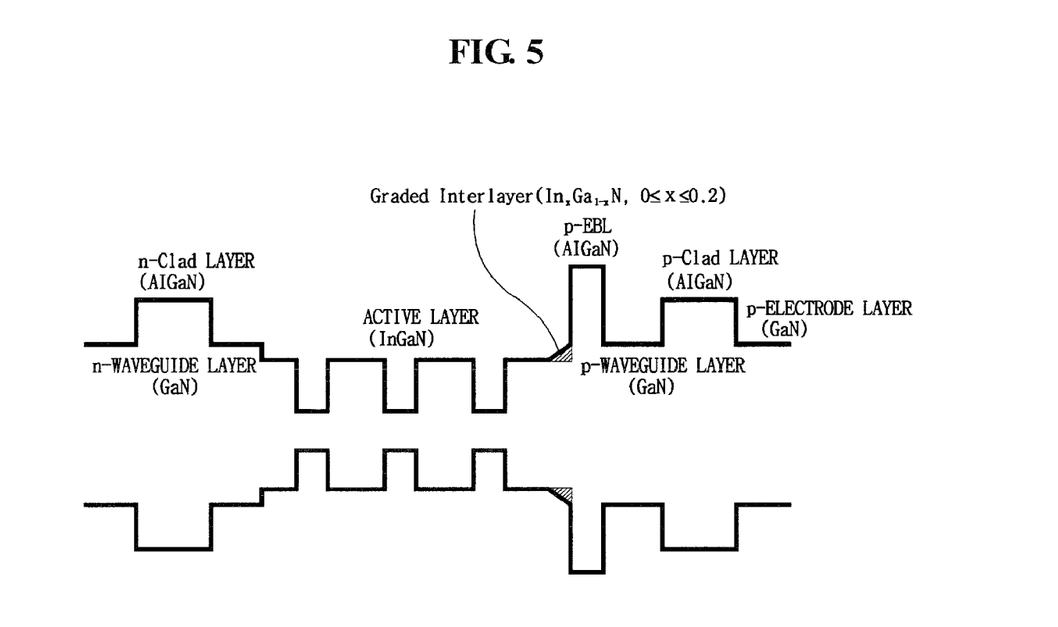
FIG. 5 is an energy band diagram of a graded interlayer composed of $In_xGa_{1-x}N(0 \leq x \leq 0.2)$ according to the present invention.

An energy band diagram of a graded interlayer composed of $In_xGa_{1-x}N(0 \leq x \leq 0.2)$ according to the present invention will be described with reference to FIG. 5. The graded interlayer is formed between an active layer composed of InGaN and an EBL composed of AlGaN by grading an indium (In) composition.

Herein, the graded interlayer is composed of $In_xGa_{1-x}N$ $(0 \leq x \leq 0.2)$. The indium (In) composition is graded in such a manner that a starting composition of indium (In) is equal to an indium (In) composition of the active layer composed of InGaN, and an ending composition of indium (In) is 0%.

Figure 6:
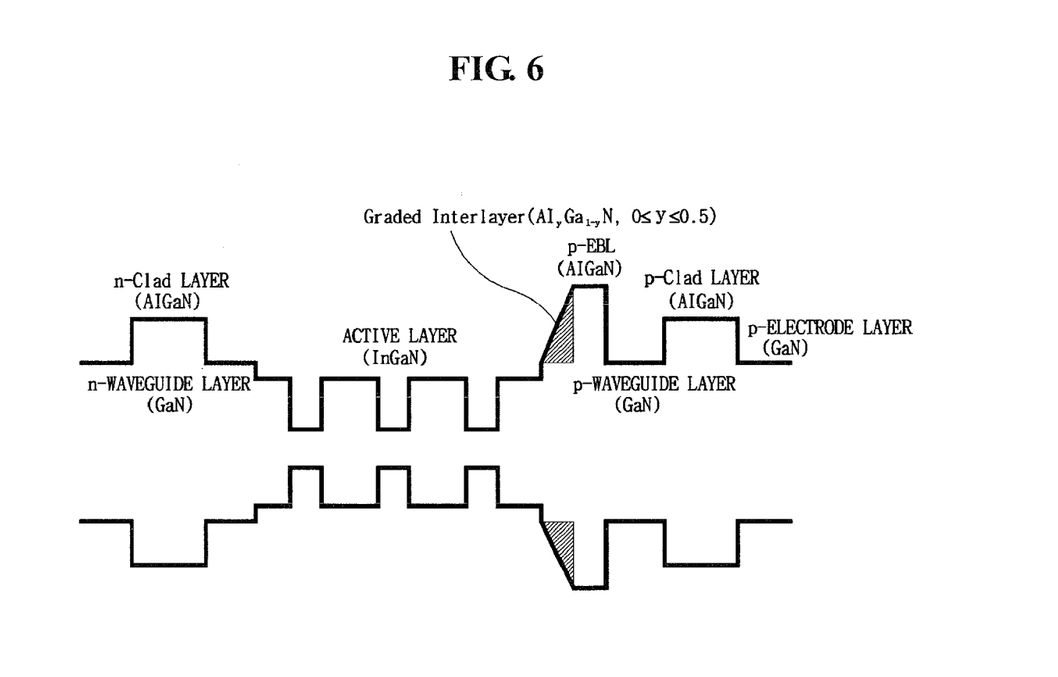
FIG. 6 is an energy band diagram of a graded interlayer composed of $Al_yGa_{1-y}N(0 \leq y \leq 0.5)$ according to the present invention.

An energy band diagram of a graded interlayer composed of $Al_yGa_{1-y}N(0 \leq y \leq 0.5)$ according to the present invention will be described with reference to FIG. 6. The graded interlayer is formed between an active layer composed of InGaN and an EBL composed of AlGaN by grading an aluminum (Al) composition.

Herein, the graded interlayer is composed of $Al_yGa_{1-y}N$ $(0 \leq y \leq 0.5)$ wherein an aluminum (Al) composition is graded such that a starting composition of aluminum (Al) is 0% and an ending composition of aluminum (Al) composition is equal to an aluminum (Al) composition of the EBL composed of AlGaN.

Figure 7:
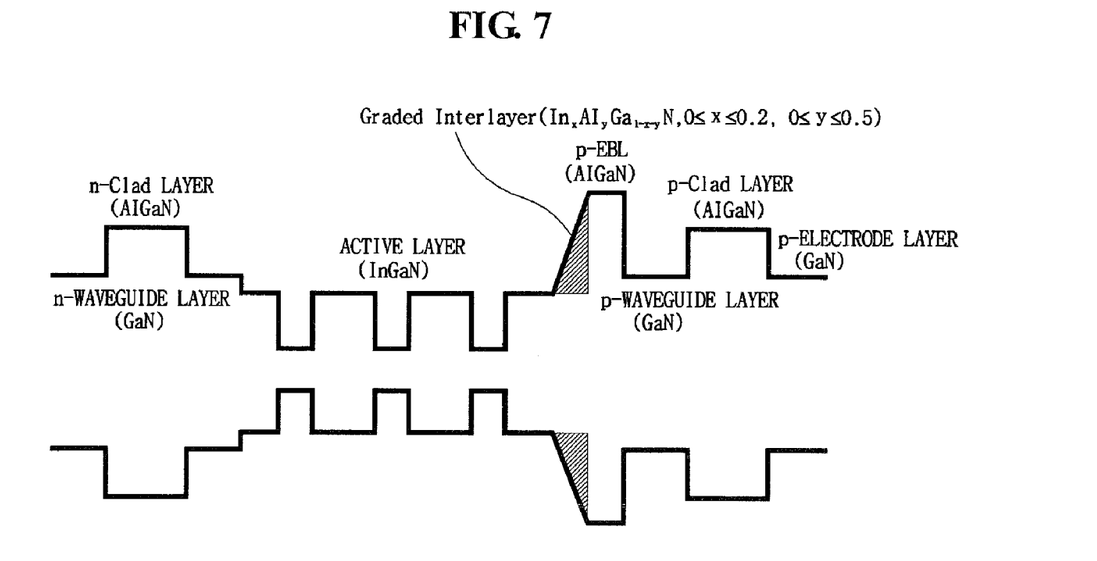
FIG. 7 is an energy band diagram of a graded interlayer composed of $In_xAl_yGa_{1-x-y}N(0 \leq x \leq 0.2, 0 \leq y \leq 0.5)$ according to the present invention.

An energy band diagram of a graded interlayer composed of $In_xAl_yGa_{1-x-y}N(0 \leq x \leq 0.2, 0 \leq y \leq 0.5)$ according to the present invention will be described with reference to FIG. 7. The graded interlayer is formed between an active layer composed of InGaN and an EBL composed of AlGaN by grading each of an indium (In) composition and an aluminum (Al) composition.

Herein, the graded interlayer is composed of $In_xAl_yGa_{1-x-y}N(0 \leq x \leq 0.2, 0 \leq y \leq 0.5)$ wherein each composition is graded such that a starting composition of indium (In) is equal to an indium (In) composition of the active layer and a starting composition of aluminum (Al) is 0% and also such that an ending composition of indium (In) is 0% and an ending composition of aluminum (Al) is equal to an aluminum (Al) composition of the EBL.

Figure 8:
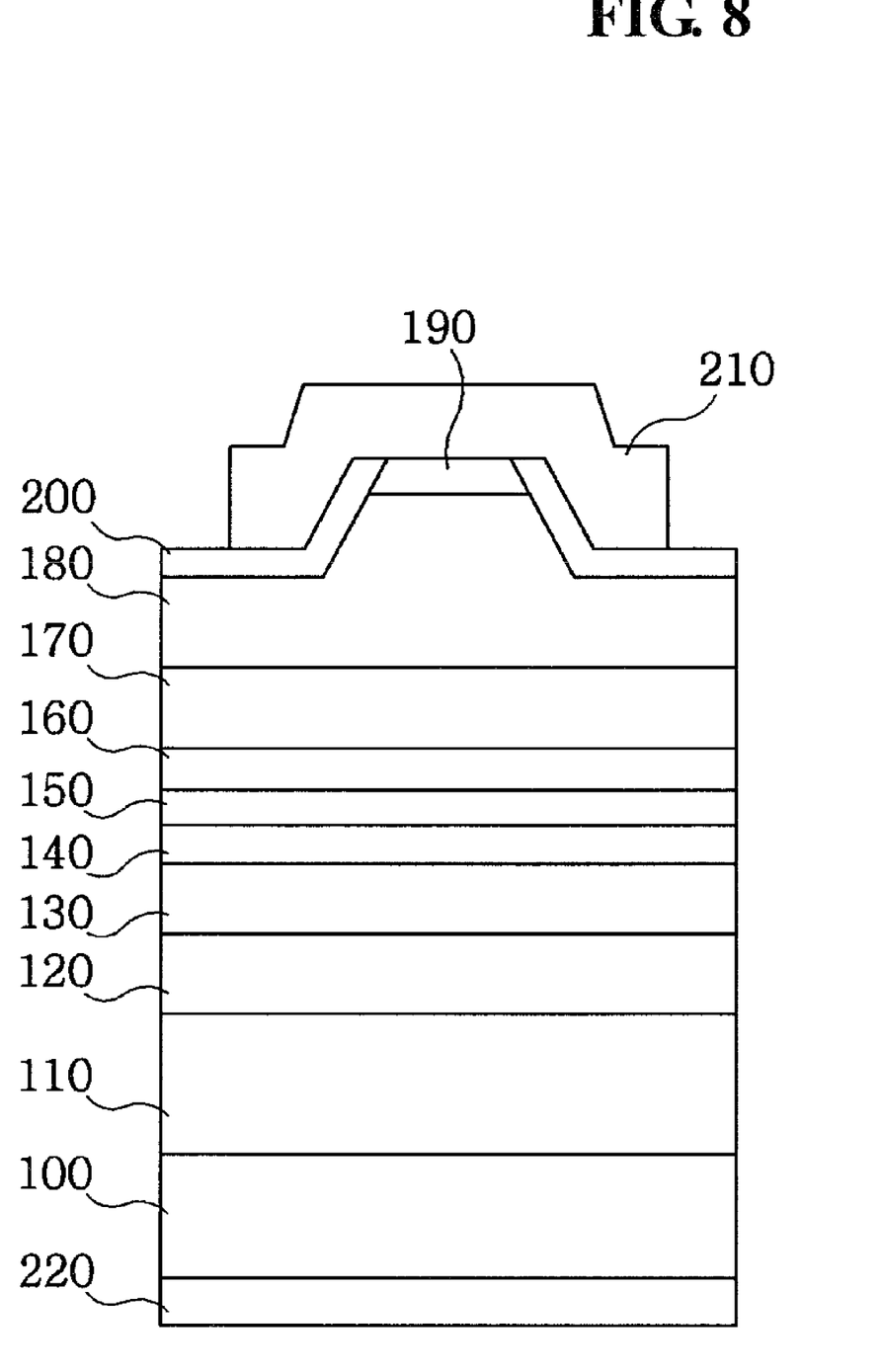
FIG. 8 is a cross-sectional view of a semiconductor laser diode having a graded interlayer according to another embodiment of the present invention.

A semiconductor laser diode having a graded interlayer according to another embodiment of the present invention will be described with reference to FIG. 8. An n-contact layer 110, an n-clad layer 120, an n-waveguide layer 130, an active layer 140, a graded interlayer 150, an EBL 160, and a p-waveguide layer 170 are sequentially laminated on an upper portion of a substrate 100.

A p-clad layer 180 having a protruding center portion is formed on an upper portion of the p-waveguide layer 170. A p-contact layer 190 is formed on the protruding portion of the p-clad layer 180 to form a ridge.

A protective layer 200 is formed on a lateral surface of the ridge and the upper portion of the p-clad layer 180.

An electrode 210 is formed by embracing the p-contact layer 190 and a portion of the protective layer 200. An electrode 220 is formed on a lower portion of the substrate 100.

As such, a structure in which the electrode 220 is formed on the lower portion of the substrate 100 is called a top-down structure. Herein, a conductive substrate (e.g., an n-GaN substrate) is used as the substrate 100.

While the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the invention is defined not by the detailed description of the invention but by the appended claims and their equivalents, and all differences within the scope will be construed as being included in the present invention.

What is claimed is:

1. A semiconductor laser diode comprising:
   a laminated structure composed of an n-contact layer, an n-clad layer, an n-waveguide layer, an active layer, a graded interlayer, an electron blocking layer (EBL), and a p-waveguide layer which are sequentially formed on an upper portion of a substrate; and
   a ridge composed of a p-clad layer, having a protruding center portion and formed on an upper portion of the p-waveguide layer, and a p-contact layer formed on an upper portion of the protruding p-clad layer,
   wherein the graded interlayer is composed of $In_xAl_yGa_{1-x-y}N$ ($0 \leq x \leq 0.2$, $0 \leq y \leq 0.5$) and is formed by grading a composition of group III materials.

2. The semiconductor laser diode of claim 1, wherein the active layer is composed of InGaN, and the EBL is composed of AlGaN.

3. The semiconductor laser diode of claim 2, wherein the graded interlayer is composed of $In_xGa_{1-x}N$ ($0 \leq x \leq 0.2$), and an indium (In) composition is graded such that a starting composition of indium (In) is 20% and an ending composition of indium (In) is 0%.

4. The semiconductor laser diode of claim 3, wherein the starting composition of indium (In) of the graded interlayer is equal to an indium (In) composition of the active layer.

5. The semiconductor laser diode of claim 2, wherein the graded interlayer is composed of $Al_yGa_{1-y}N$ ($0 \leq y \leq 0.5$), and an aluminum (Al) composition is graded such that a starting composition of aluminum (Al) is 0% and an ending composition of aluminum (Al) is 50%.

6. The semiconductor laser diode of claim 5, wherein the ending composition of aluminum (Al) of the graded interlayer is equal to an aluminum (Al) composition of the EBL.

7. The semiconductor laser diode of claim 2, wherein the graded interlayer is composed of $In_xAl_yGa_{1-x-y}N$ ($0 \leq x \leq 0.2$, $0 \leq y \leq 0.5$), and an indium (In) composition and an aluminum (Al) composition are graded such that starting compositions of indium (In) and aluminum (Al) are respectively 20% and 0% and ending compositions of indium (In) and aluminum (Al) are respectively 0% and 50%.

8. The semiconductor laser diode of claim 7, wherein the starting composition of indium (In) of the graded interlayer is equal to the indium (In) composition of the active layer, and the ending composition of aluminum (Al) is equal to the aluminum (Al) composition of the EBL.

9. The semiconductor laser diode of claim 1, wherein a doping type of the graded interlayer is any one of an n-type, a p-type, and an undoped type.

10. A semiconductor laser diode, wherein:
    an n-contact layer, an n-clad layer, an n-waveguide layer, an active layer, a graded interlayer, an electron blocking layer (EBL), and a p-waveguide layer are sequentially formed on an upper portion of a substrate;
    a portion of the n-contact layer is exposed by performing mesa etching on regions from the p-waveguide layer to a portion of the n-contact layer;
    a p-clad layer having a protruding center portion is formed on an upper portion of the p-waveguide layer, and a p-contact layer is formed on an upper portion of the protruding p-clad layer to form a ridge;
    a protective layer is formed on a lateral surface of the ridge and the upper portion of the p-clad layer;
    an electrode is formed by embracing the p-contact layer and a portion of the protective layer;
    an electrode is formed on an upper portion of the exposed n-contact layer; and
    the graded interlayer is composed of $In_xAl_yGa_{1-x-y}N$ ($0 \leq x \leq 0.2$, $0 \leq y \leq 0.5$), and is formed by grading a composition of group III materials.

11. The semiconductor laser diode of claim 10, wherein the active layer is composed of InGaN, and the EBL is composed of AlGaN.

12. The semiconductor laser diode of claim 11, wherein the graded interlayer is composed of $In_xGa_{1-x}N$ ($0 \leq x \leq 0.2$), and an indium (In) composition is graded such that a starting composition of indium (In) is equal to an indium (In) composition of the active layer and an ending composition of indium (In) is 0%.

13. The semiconductor laser diode of claim 11, wherein the graded interlayer is composed of $Al_yGa_{1-y}N$ ($0 \leq y \leq 0.5$), and an aluminum (Al) composition is graded such that the ending composition of aluminum (Al) is equal to an aluminum (Al) composition of the EBL.

14. The semiconductor laser diode of claim 11, wherein the graded interlayer is composed of $In_xAl_yGa_{1-x-y}N$ ($0 \leq x \leq 0.2$, $0 \leq y \leq 0.5$), and an indium (In) composition and an aluminum (Al) composition are graded such that the starting composition of indium (In) is equal to the indium (In) composition of the active layer and the ending composition of indium (In) is 0%, and also such that the starting composition of aluminum (Al) is 0% and the ending composition of aluminum (Al) is equal to the aluminum (Al) composition of the EBL.

15. A semiconductor laser diode, wherein:
    an n-contact layer, an n-clad layer, an n-waveguide layer, an active layer, a graded interlayer, an electron blocking layer (EBL), and a p-waveguide layer are sequentially formed on an upper portion of a substrate;
    a p-clad layer having a protruding center portion is formed on an upper portion of the p-waveguide layer, and a p-contact layer is formed on an upper portion of the protruding p-clad layer to form a ridge;
    a protective layer is formed on a lateral surface of the ridge and the upper portion of the p-clad layer;
    an electrode is formed by embracing the p-contact layer and a portion of the protective layer;
    an electrode is formed on a lower portion of the substrate; and the graded interlayer is composed of $In_xAl_yGa_{1-x-y}N$ ($0 \leq x \leq 0.2$, $0 \leq y \leq 0.5$), and is formed by grading a composition of group III materials.

16. The semiconductor laser diode of claim 15, wherein the active layer is composed of InGaN, and the EBL is composed of AlGaN.

17. The semiconductor laser diode of claim 16, wherein the graded interlayer is composed of $In_xGa_{1-x}N(0 \leq x \leq 0.2)$, and an indium (In) composition is graded such that a starting composition of indium (In) is equal to an indium (In) composition of the active layer and an ending composition of indium (In) is 0%.

18. The semiconductor laser diode of claim 16, wherein the graded interlayer is composed of $Al_yGa_{1-y}N(0 \leq y \leq 0.5)$, and an aluminum (Al) composition is graded such that the ending composition of aluminum (Al) is equal to an aluminum (Al) composition of the EBL.

19. The semiconductor laser diode of claim 16, wherein the graded interlayer is composed of $In_xAl_yGa_{1-x-y}N(0 \leq x \leq 0.2, 0 \leq y \leq 0.5)$, and an indium (In) composition and an aluminum (Al) composition are graded such that the starting composition of indium (In) is equal to the indium (In) composition of the active layer and the ending composition of indium (In) is 0%, and the starting composition of aluminum (Al) is 0% and the ending composition of aluminum (Al) is equal to the aluminum (Al) composition of the EBL.

20. The semiconductor laser diode of claim 15, wherein a doping type of the graded interlayer is any one of an n-type, a p-type, and an undoped type.

* * * * *